(12) United States Patent
Desmedt et al.

(10) Patent No.: US 8,009,270 B2
(45) Date of Patent: Aug. 30, 2011

(54) UNIFORM BACKGROUND RADIATION IN MASKLESS LITHOGRAPHY

(75) Inventors: Paul Antoon Cyriel Desmedt, Eindhoven (NL); Patricius Aloysius Jacobus Tinnemans, Hapert (NL); Minne Cuperus, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1191 days.

(21) Appl. No.: 11/689,926

(22) Filed: Mar. 22, 2007

(65) Prior Publication Data

US 2008/0231826 A1    Sep. 25, 2008

(51) Int. Cl.
*G03B 27/42* (2006.01)
(52) U.S. Cl. .......... 355/53; 359/290; 359/295; 359/298
(58) Field of Classification Search .................... 355/53; 359/290–295, 298
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,285,488 B1 * | 9/2001 | Sandstrom | 359/290 |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,870,554 B2 | 3/2005 | Jain | |
| 6,870,601 B2 | 3/2005 | Liebregts et al. | |
| 2002/0054660 A1 * | 5/2002 | Komatsuda et al. | 378/34 |
| 2003/0160980 A1 * | 8/2003 | Olsson et al. | 358/1.9 |
| 2005/0007572 A1 | 1/2005 | George et al. | |
| 2005/0046819 A1 * | 3/2005 | Bleeker et al. | 355/67 |
| 2006/0187428 A1 * | 8/2006 | Bleeker et al. | 355/53 |

FOREIGN PATENT DOCUMENTS

| | | |
|---|---|---|
| WO | WO 98/33096 A1 | 7/1998 |
| WO | WO 98/38597 A2 | 9/1998 |
| WO | WO 98/38597 A3 | 9/1998 |

\* cited by examiner

*Primary Examiner* — Edward J. Glick
*Assistant Examiner* — Mesfin T Asfaw
(74) *Attorney, Agent, or Firm* — Sterne, Kessler, Goldstein & Fox P.L.L.C.

(57) ABSTRACT

A device manufacturing method comprising applying patterns to a plurality of arrays of individually controllable elements, such that they modulate a beam of radiation, and projecting the modulated beam of radiation onto a substrate. The patterns applied to the arrays of individually controllable elements are arranged such that pre-determined amounts of background radiation are included in the modulated beam of radiation. The pre-determined amounts of background radiation being different for different locations on the arrays.

20 Claims, 5 Drawing Sheets

UNIFORM BACKGROUND RADIATION IN MASKLESS LITHOGRAPHY

BACKGROUND

1. Field of the Invention

The present invention relates to a lithographic system and device manufacturing method.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

The number of individually controllable elements which may be provided in a given array may be restricted, for example due to manufacturing limitations. For this reason, it may be desired to provide several arrays of individually controllable elements in a given lithographic apparatus. Patterns projected from the arrays onto the substrate may be stitched together. Problems may arise as a result of this stitching together of the patterns.

Therefore, what is needed is a system and method directed to overcoming or substantially mitigating at least one problem associated with stitching together of patterns formed using multiple arrays of individually controllable elements.

SUMMARY

In one embodiment, there is provided a device manufacturing method comprising the following steps. Applying patterns to a plurality of arrays of individually controllable elements such that they modulate a beam of radiation. Projecting the modulated beam of radiation onto a substrate. The patterns applied to the arrays of individually controllable elements are arranged such that pre-determined amounts of background radiation are included in the modulated beam of radiation, the pre-determined amounts of background radiation being different for different locations on the arrays.

According to another embodiment of the present invention, there is provided a lithographic apparatus comprising a plurality of arrays of individually controllable elements, a projection system, and a controller. The plurality of arrays of individually controllable elements are arranged to be patterned such that they modulate a beam of radiation. The projection system is arranged to project the modulated beam of radiation onto a substrate. The controller is arranged to control patterns provided on the arrays of individually controllable elements. The controller is arranged to apply patterns to the arrays of individually controllable elements. The patterns being configured such that pre-determined amounts of background radiation are included in the beam of radiation as modulated by the arrays. The pre-determined amounts of background radiation being different for different locations on the arrays.

According to a further embodiment of the present invention, there is provided a device manufacturing method comprising the following steps. Modulating a beam of radiation using a plurality of arrays of individually controllable elements. Projecting the modulated beam of radiation onto a substrate to form a plurality of patterned regions on the substrate. The positions of the patterned regions are staggered, such that there are no locations on the substrate which receive more than three patterned regions.

According to a still further embodiment of the present invention, there is provided a lithographic apparatus comprising a plurality of arrays of individually controllable elements, a projection system, and a controller. The plurality of arrays of individually controllable elements are arranged to be patterned such that they modulate a beam of radiation. The projection system is arranged to project the modulated beam of radiation onto a substrate. The controller is arranged to control patterns provided on the arrays of individually controllable elements. The arrays of individually controllable elements are not aligned in a direction transverse to a scanning direction of the lithographic apparatus, but instead have a separation in the scanning direction. The separation being a non-integer multiple of the lengths of the arrays in the scanning direction.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Figure 1:
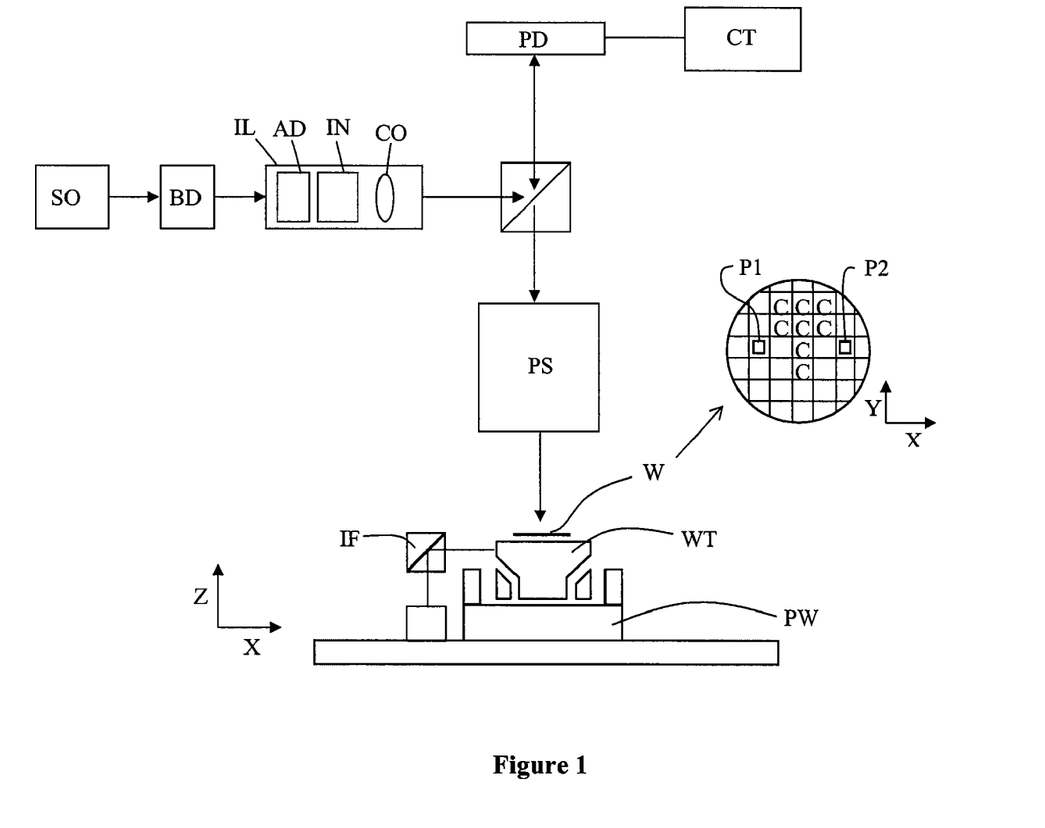
FIG. 1 depicts a lithographic apparatus.

FIG. 1 schematically depicts the lithographic apparatus 1 of one embodiment of the invention. The apparatus comprises an illumination system IL, a patterning device PD, a controller CT coupled to the patterning device PD, a substrate table WT, and a projection system PS. The illumination system (illuminator) IL is configured to condition a radiation beam B (e.g., UV radiation).

It is to be appreciated that, although the description is directed to lithography, the patterned device PD can be formed in a display system (e.g., in a LCD television or projector), without departing from the scope of the present invention. Thus, the projected patterned beam can be projected onto many different types of objects, e.g., substrates, display devices, etc.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam cannot exactly correspond to the desired pattern in the target portion of the substrate, for example if the pattern includes phase-shifting features or so called assist features. Similarly, the pattern eventually generated on the substrate cannot correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend on the substrate material and/or the substrate dimensions. The thickness can be at least 50 μm, at least 100 μm, at least 200 μm, at least 300 μm, at least 400 μm, at least 500 μm, or at least 600 μm. Alternatively, the thickness of the substrate can be at most 5000 μm, at most 3500 μm, at most 2500 μm, at most 1750 μm, at most 1250 μm, at most 1000 μm, at most 800 μm, at most 600 μm, at most 500 μm, at most 400 μm, or at most 300 μm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA can be movable (e.g., with the use of one or more actuators) at least in the direction to and away from the substrate. Being able to move the MLA to and away from the substrate allows, e.g., for focus adjustment without having to move the substrate.

Figure 2:
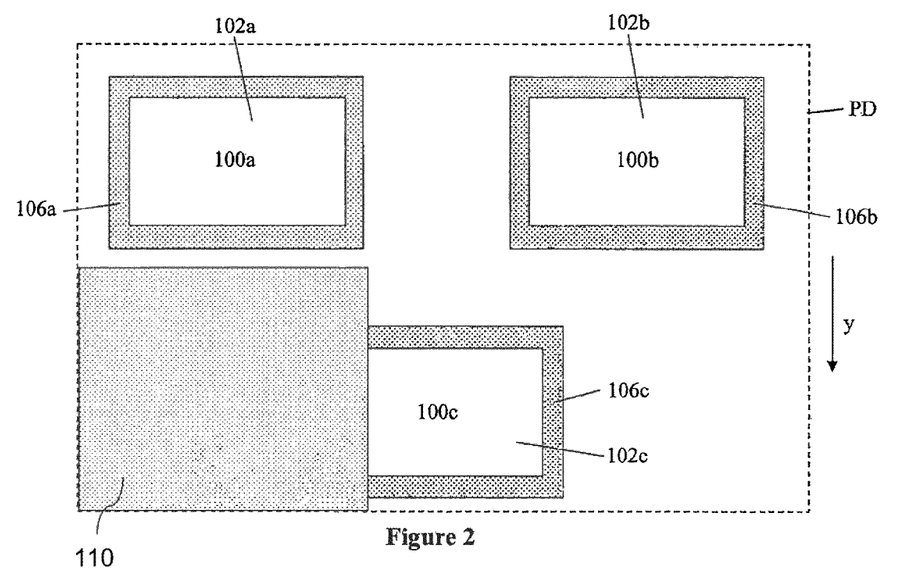
FIG. 2 depicts a patterning device which forms part of the apparatus shown in FIG. 1.

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 10 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage cannot be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 cannot be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore control signals, representing the requisite states, must be transmitted to each of the individually controllable elements. Preferably, the lithographic apparatus includes a controller that generates the control signals. The pattern to be formed on the substrate may be provided to the lithographic apparatus in a vector-defined format such as GDSII. In order to convert the design information into the control signals for each individually controllable element, the controller includes one or more data manipulation devices, each configured to perform a processing step on a data stream that represents the pattern. The data manipulation devices may collectively be referred to as the "datapath".

The data manipulation devices of the datapath may be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

The number of individually controllable elements which may be provided in a given array may be limited, for example, due to manufacturing limitations. For this reason a given lithographic apparatus may include a plurality of arrays of individually controllable elements.

In the following description the individually controllable elements referred to are mirrors. This is to facilitate a simple explanation of the invention. However, other individually controllable elements may be used of instead of mirrors.

FIG. 2 shows 3 mirror arrays 100a-c, which together may be considered to form a patterning device PD. Each mirror array comprises, for example, one million mirrors, each of which is individually controllable. In FIG. 2 the mirrors are indicated by the white regions 102a-c. Each mirror array 100a-c also includes a border 106a-c. The border is patterned such that it resembles the mirrors. However, the border is static and does not include individually moveable mirrors.

Referring to FIGS. 1 and 2, in use patterns are provided on each of the mirror arrays 100a-c by appropriate orientation of the mirrors 102a-c. The source SO is then used to illuminate the patterning device PD with radiation, which is then directed, via the projection system PS, onto a substrate W. Doing this exposes three regions on the substrate, which correspond with the 3 mirror arrays 100a-c. Once the regions have been exposed, the substrate is moved, for example, in the Y direction. The patterns provided on the mirror arrays 100a-c may be modified, and the radiation is again used to project the patterns onto the substrate W. This may be, for example, the pulsed mode of operation of the lithographic apparatus, which is referred to further above. The process is repeated a plurality of times until predetermined portions of the substrate W have received appropriate patterns.

Figure 3:
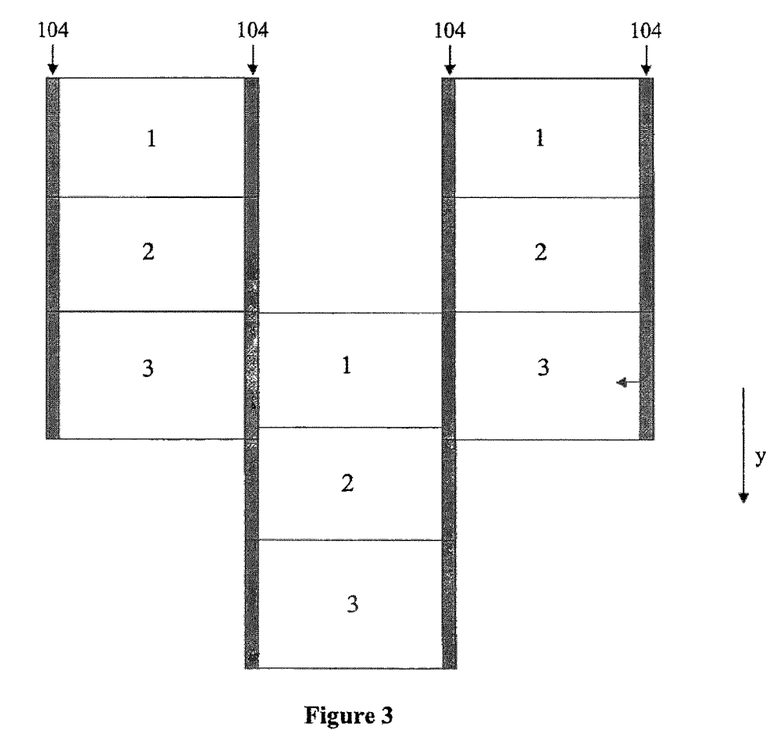
FIG. 3 depicts overlapping patterns projected onto a substrate.

FIG. 3 shows schematically how a patterned area may be built up by adding together individual patterned areas that are each formed using a mirror array. During a first illumination period, radiation illuminates patterns on the mirror arrays, which are projected by the lithographic apparatus onto a substrate. These patterns are labeled with 1 in FIG. 3. The substrate is then moved in the y-direction by a distance that is slightly less than the length of the active parts 102a-c of the mirror arrays 100a-c in the y-direction. A second illumination period then commences, during which patterns are again projected onto the substrate. These patterns are labelled 2 in FIG. 3. The substrate is again moved in the y-direction, and a third illumination period is used to again project patterns onto the substrate. These patterns are labelled 3.

It can be seen from FIG. 3 that movement of the substrate between illumination periods in this manner allows a patterned area to be built up. The illumination period may comprise a predetermined number of pulses of radiation, a predetermined period required in order to deliver a required dose of radiation to the substrate, or any other suitably measured period.

In FIG. 3 it can be seen that there is a region of overlap 104, which receives radiation from more than one mirror array. Stitching is used in the region of overlap 104. The stitching being arranged such that the patterned areas combine together properly to form a larger patterned area. In a given region of overlap 104, the same pattern is provided on each of the mirror arrays 100a-c, which directs radiation towards that region. In order to avoid over-exposing the region of overlap, the amount of radiation directed by each of the mirror arrays is reduced in the overlap region.

Figure 4:
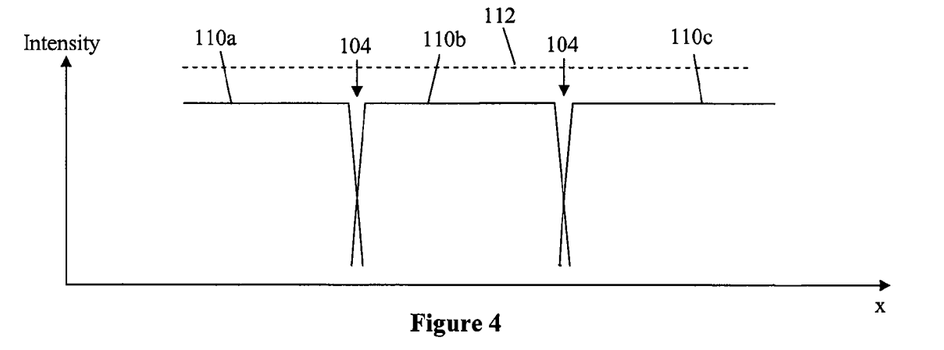
FIGS. 4 and 5 are graphs which show the intensity of radiation directed onto different locations on the substrate.

FIG. 4 is a graph showing the variation of intensity projected onto the substrate along a line drawn across the substrate in the x-direction. The graph assumes that instead of a pattern being present on each mirror array, the mirrors are all set to 'on' (i.e., it is intended that the substrate receives the same amount of radiation at all locations). It can be seen by looking at FIGS. 3 and 4 in combination, that in the regions 104, where there is overlap between the mirrors of different mirror arrays, the amount of radiation projected onto the substrate is tapered off gradually. The tapering is intended to be arranged such that the radiation provided from each of the arrays sums together to give the same total amount of radiation as is provided at other locations. The sum of radiation is shown as a dotted line 112. It can be seen that the line 112 is flat.

Figure 5:
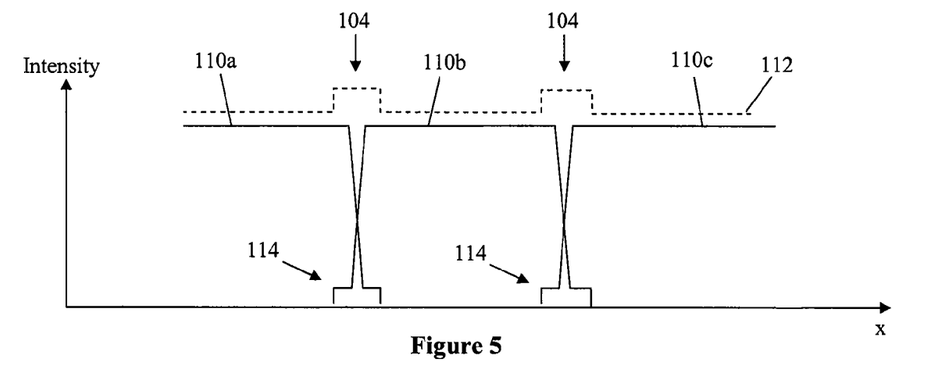

FIG. 5 is a graph showing the variation of intensity projected onto the substrate along a line drawn across the substrate in the x-direction. Again, the graph assumes that instead of a pattern being present on each mirror array, the mirrors are all set to 'on' (i.e., it is intended that the substrate receive the same amount of radiation at all locations). As in FIG. 4, in the regions 104 where there is overlap between the mirrors of different mirror arrays, the amount of radiation delivered is tapered off gradually. However, instead of the substrate receiving the same total amount of radiation at all locations, extra radiation is received at the overlap regions 104. It can be seen that the sum of radiation, which is shown as a dotted line 112, is not flat. Instead, the sum of radiation is greater at the overlap regions 104 than at other locations.

The extra radiation is background radiation, which is reflected from the borders 106a-c of the mirror arrays. The background radiation is not zero because even though the borders are intended to reflect no radiation, some radiation is still reflected. In one example, $\lambda/4$ steps may be included in the borders 106a-c, the steps being arranged such that destructive interference of radiation reflected by the steps occurs. However, due to manufacturing tolerances the step may not be precisely $\lambda/4$, with the result that some background radiation is reflected by the borders.

The background radiation generated by each mirror array 100a-c can be seen in FIG. 5 as steps 114.

The increased radiation in the regions of overlap 104 may have a negative impact on the critical dimension (CD) of patterns projected onto the substrate. For example, when projecting lines onto a substrate, lines located in the regions of overlap may be thicker than lines that are not in the overlap regions. It is desirable to remove or reduce this unwanted variation of the critical dimension.

Figure 6:
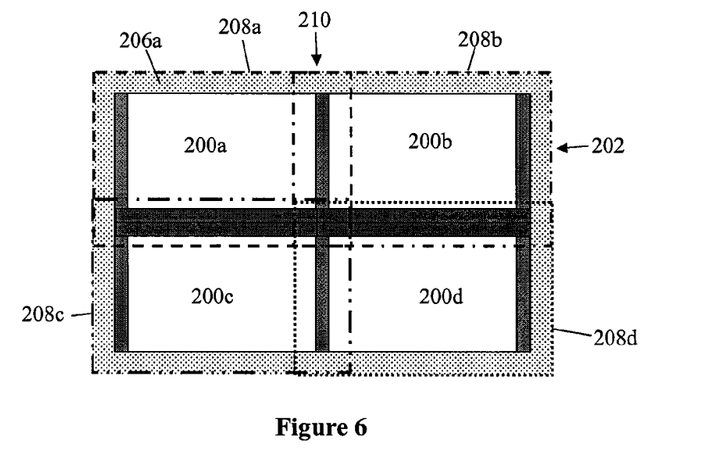
FIGS. 6 and 7 show schematically the effect of overlapping patterns projected onto the substrate.

FIG. 6 shows schematically a substrate region that has received a pattern 202 formed from the combination of four separate patterns 200a-d. In common with FIG. 3, grey areas indicate locations at which radiation is received from more than one set of mirrors. In addition, dashed lines indicate areas that receive radiation from borders of the mirror arrays. Referring to the top left hand corner of FIG. 6, a portion of the substrate 206a is visible that receives radiation from a border of a mirror array. The entire border projected from that mirror array cannot be seen because parts of it overlap with radiation received from other mirror arrays. However, the outline of the border is indicated by a dotted line 208a. The outline of the border is shown for each of the mirror arrays. Each border is indicated using a different type of line 208a-d, in order to assist the reader in distinguishing between them. It can be seen that the region of overlap between mirror arrays (including borders) forms a cross-shape 210.

Figure 7:
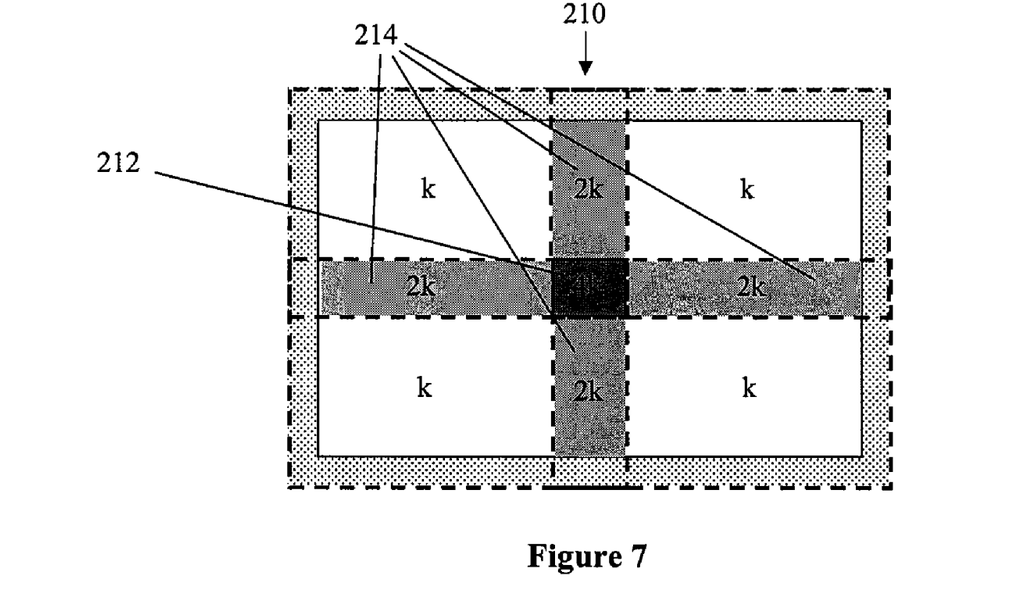

The cross-shape 210 is shown in FIG. 7 in a simplified form. In the simplified form, regions in which the mirrors of the arrays overlap are not indicated, whereas regions in which the borders of the arrays overlap are indicated with shading. Light grey shading 214 indicates that radiation is received from two mirror arrays. Dark grey shading, which is in a central location 212, indicates that radiation is received from four mirror arrays.

In an embodiment of the invention, additional background radiation is added to some locations on the substrate, such that the amount of background radiation received at all locations on the substrate is substantially equal (or includes less variation than would otherwise be the case).

It should be appreciated that background radiation is present to some degree at all locations of the pattern. This is because, in addition to the borders 106a-c reflecting background radiation, the mirrors 102a-c of the arrays will also reflect background radiation. For example, the mirrors may be provided with a $\lambda/4$ phase step, which may give rise to some background radiation due to the phase step being manufactured imperfectly.

FIG. 7 shows the amount of background radiation that is present at different locations on the substrate. Typically the background radiation may be around 1.5% of the maximum available radiation intensity. This is represented in FIG. 7 by the value 'k'. Areas on the substrate which receive radiation from only one mirror array (shown in white in FIG. 7) will receive k background radiation. Regions on the substrate that receive radiation from two mirror arrays (given light grey shading) will receive 2 k background radiation. A central region that receives radiation from four mirror arrays (given dark grey shading) will receive 4 k background radiation.

Figure 8:
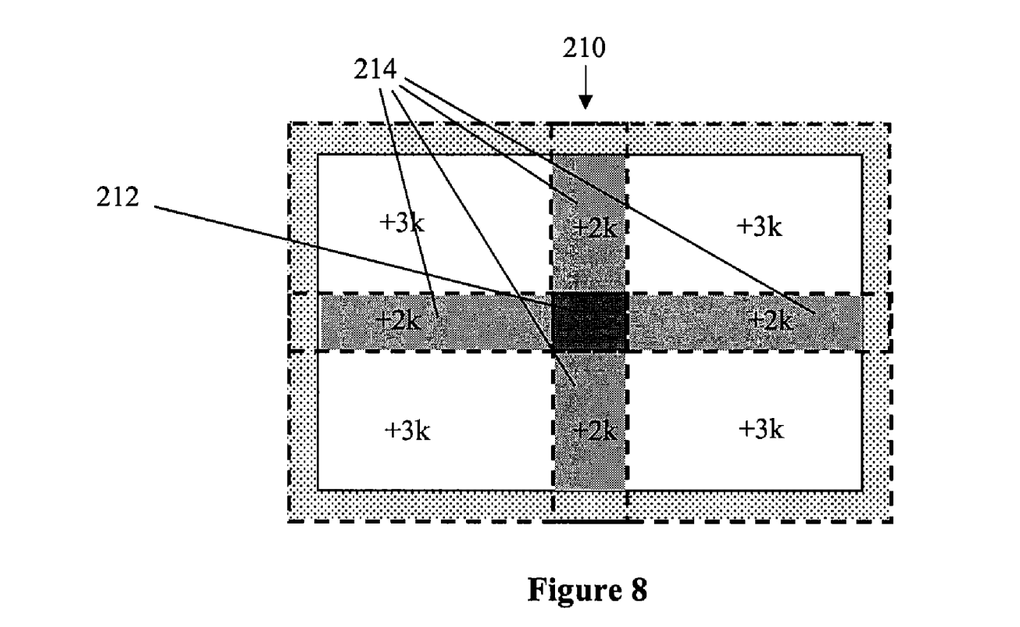
FIGS. 8 and 9 schematically depict how overlapping patterns may be modified.

Referring to FIG. 8, in order to arrange that each part of the substrate receives the same amount of background radiation, appropriate additional amounts of background radiation are added at different locations. The light grey shaded regions receive 2 k additional background radiation (since they have already received 2 k background radiation). The white regions receive 3 k additional background radiation (since they have already received k background radiation). The dark grey shaded central region 212 does not receive any additional radiation.

The result of adding background radiation in the manner shown in FIG. 8 is that all locations on the pattern receive a total of 4 k background radiation. In other words, a substantially uniform background radiation level is seen at all locations. Since the same amount of background radiation is received at all locations in the pattern, the features of the pattern should be formed with the same thickness, i.e., the critical dimension of the pattern should not vary due to background radiation differences.

Although only a small pattern area is shown in FIG. 8, this embodiment of the invention may be used, for example, for a much larger area, via the appropriate addition of background radiation. For ease of illustration, outer edges of the patterned area in FIG. 8 do not include additional patterned areas. For this reason, the outer areas of FIG. 8 do not include labels indicating where additional background radiation should be added. These areas therefore do not illustrate this particular embodiment of the invention.

In order to add additional background radiation in the manner shown in FIG. 8, the orientations of mirrors 102a-c of the arrays are adjusted. When determining the desired orientation of the given mirror, an offset may be added to the orientation, the offset being determined by the amount of additional background radiation that is to be added. The offset may be added during computation of each pattern to be provided on the mirrors, as part of the computation. Alternatively, it may be possible to provide DC offsets to control voltages delivered to mirrors, the offsets modifying the orientations of the mirrors such that the desired amount of background radiation is added.

The pattern applied to a given mirror array may be such that the amount of background radiation included in the radiation beam as modulated by one location on the array is twice as much as the background radiation included in the radiation beam as modulated by a different location on the array. It may be such that the amount of background radiation is three times as much, four times as much, or more.

It is not essential that the amount of background radiation included in the radiation beam as modulated by one location on the array is an integer number times the background radiation included in the radiation beam as modulated by a different location on the array. A general approach may comprise determining the amount of background radiation that will be received at different locations on the substrate, and determining the maximum amount of radiation that will be received on the substrate. A calculation may then determine the amounts of additional background radiation that should be added to locations on the substrate which receive less than the maximum amount of background radiation, such that those locations on the substrate receive the maximum amount of background radiation (or a substantially similar amount of background radiation).

Figure 9:
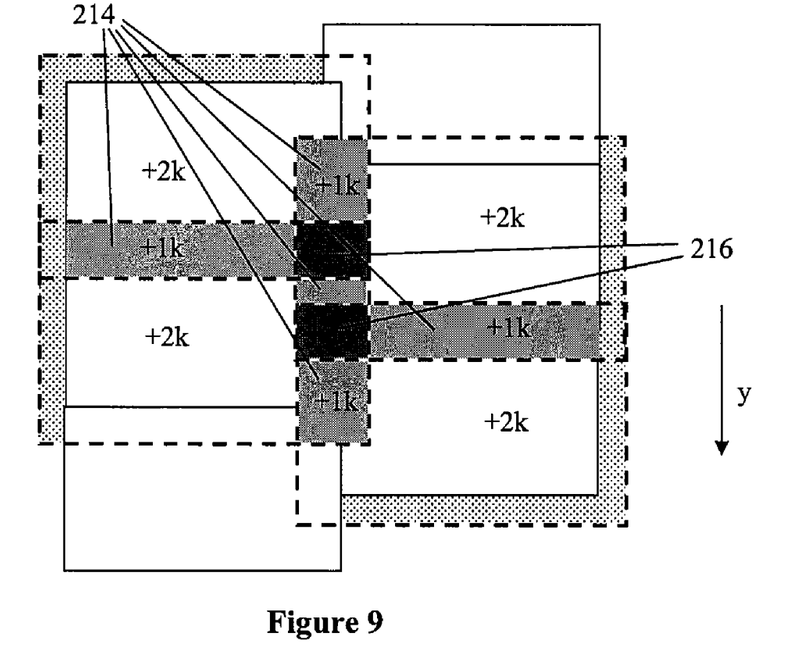

A further embodiment of the invention is shown schematically in FIG. 9. Six patterns have been added together on a substrate. However, instead of the patterns being aligned with one another in the manner shown in FIG. 8, the patterns are offset in the y-direction. Areas 214 which receive radiation from two mirror arrays are shaded with light grey. Areas 216 which receive radiation from three mirror arrays are shaded with dark grey. There are no areas which receive radiation from 4 mirror arrays. This staggering on the substrate of the patterns reduces the amount of background radiation that is added to the patterns.

In order to arrange that each part of the substrate receives the same amount of background radiation, appropriate additional amounts of background radiation are added at different locations. The white regions receive 2 k additional background radiation (since they have already received k background radiation). The light grey shaded regions receive k additional background radiation (since they have already received 2 k background radiation). The dark grey shaded regions 216 do not receive any additional radiation.

Each area of the pattern in FIG. 9 receives a total of 3 k background radiation. This compares with the pattern in FIG. 8, in which each area received a total of 4 k background radiation.

Reducing the amount of background radiation incident upon the pattern is advantageous because this can increase the manufacturing tolerances that may be permitted when manufacturing the mirror arrays. For example, a mirror array may be manufactured with a particular tolerance, such that when the mirror is oriented to reflect no radiation it reflects 1.5% of the radiation incident upon it. As mentioned further above, this may, for example, be due to an inaccuracy in the height of a phase step provided in the mirror. Where this is the case, in a situation such as that shown in FIG. 8, four times the background radiation will be added to the pattern, i.e., 6% of the incident radiation. This is a significant proportion of the radiation, and may give rise to difficulties when projecting radiation onto the substrate. In contrast, if an arrangement such as that shown in FIG. 9 is used, then the amount of background radiation that will be projected onto the substrate will be three times the background radiation, i.e., 4.5% of the incident radiation. This is a significant reduction.

The separation in the y-direction between the centers of the mirror arrays in FIG. 2 is two times the length of the active part of each mirror array in the y-direction (the active part comprises the moveable mirrors 102a,c). However, it may be desirable in some cases to have a significantly larger separation, for example 5 times the length of the active part of each mirror array or more. This may be convenient, for example, because it may provide space around the mirror arrays for associated electronics etc. Where this is done, the operation of the lithographic apparatus is unchanged, although more mirror array patterns must be projected before overlap of the patterns begins. As mentioned above, it is not essential that the separation is an integer number times the length of the active part of each mirror arrays in the y-direction. Any suitable separation may be used.

FIG. 9 shows staggering between patterns formed on a substrate by mirror arrays having a separation that is approximately half of the length of the active part of each mirror array in the y-direction. However, separation of the mirror arrays by other amounts may be used. For example, a separation between mirror arrays that is equal to one quarter of the active part of each mirror array in the y-direction may be used. Any suitable separation may be used, although it should not give rise to areas in which 4 times the background radiation is directed onto the substrate.

Figure 10:
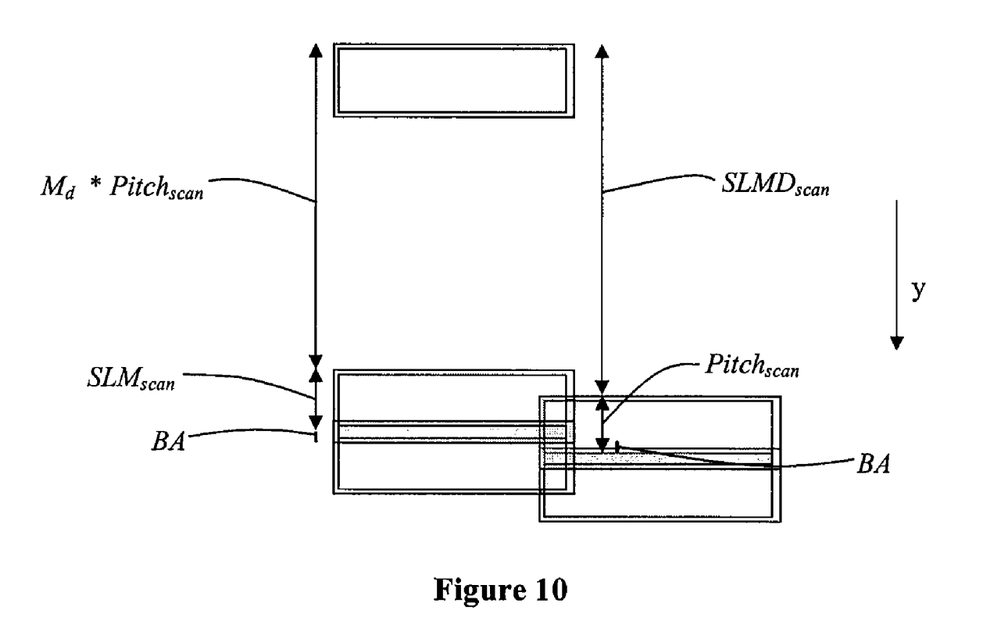
FIG. 10 shows several patterns formed on a substrate by mirror arrays.

One manner in which the separation may be determined is shown schematically in FIG. 10, which shows several patterns which have been formed on a substrate by mirror arrays. Various distances are labelled in FIG. 10.

Referring first to the left hand side of FIG. 10, the length in the y-direction that is patterned by a given mirror array (not including overlap with an adjacent pattern) is $Pitch_{scan}$. For a given set of mirror arrays, it is desired to have a value of $Pitch_{scan}$, which allows a good throughput, while providing sufficient overlap between adjacent patterns. Different types of patterns may require different amounts of overlap.

An optimal separation between mirror arrays in the y-direction may be determined. The optimal separation may be a separation which just avoids the situation in which four patterns are projected onto the same location (the situation shown in FIG. 7), when the maximum possible value of $Pitch_{scan}$ is used, but which also allows a minimal value of $Pitch_{scan}$ to be used. Using the optimal separation gives a broad range of possible values of $Pitch_{scan}$, and thereby provides the lithographic apparatus with a broad range of usable pitch values.

In this example the maximum possible value of $Pitch_{scan}$ may be 40 microns. This distance is multiplied by $M_d$, which is an integer number, in this case 5. $M_d$ indicates the desired approximate separation between mirror arrays. $SLM_{scan}$ is the distance in the y-direction which is patterned by a given mirror array (including overlap with an adjacent pattern). In this example $SLM_{scan}$ may be about 42 microns. Since $Pitch_{scan}$ is about 40 microns, this means that there is an overlap of about 2 microns between adjacent patterns. BA is the length in the y-direction which receives radiation from the border of the mirror array. In this example BA is about 2.5 microns.

Referring to the right hand side of FIG. 10, $SLMD_{scan}$ is the distance between the mirror arrays in the y-direction (as measured at substrate level). This is the distance to be determined. $Pitch_{scan}$ and BA have already been defined.

The distances on either side of FIG. 10 are equal, and hence can be expressed as follows:

$$M_d * Pitch_{scan} + SLM_{scan} + BA = SLMD_{scan} + Pitch_{scan} - BA$$

This can be rearranged to:

$$SLMD_{scan} = M_d * Pitch_{scan} + (SLM_{scan} - Pitch_{scan}) + 2*BA.$$

Using the values given above, $SLMD_{scan}=207$ microns. This value can be used to determine the desired separation of the mirror arrays as provided on the patterning device PD, by dividing the value by the reduction factor of the projection system of the lithographic apparatus. The reduction factor may, for example, be about 400, which in this example would give a separation between adjacent mirror arrays of about 82.8 millimetres.

If it is desired to put the mirror arrays closer together, then the same equation may be used. The value of $M_d$ may, for example, be changed to 4 instead of 5, with other values remaining the same. This would give $SLMD_{scan}=167$ microns (equivalent to about 66.8 millimetres).

If a different size of mirror array is used, or a different amount of overlap between adjacent patterns is desired, then the values used in the above equation should be changed as appropriate.

It is possible that mirror arrays may be used having borders that do not reflect radiation, or which reflect a negligible amount of radiation. Where this is the case, the term BA in the above equation may be set to zero. In the example given above if BA=0, then this gives $SLMD_{scan}=202$ microns.

In general terms, the maximum possible value for $Pitch_{scan}$ will depend upon the length of the active part of the mirror array in the y-direction ($SLM_{scan}$), and the overlap required in the scan direction due to stitching considerations. If this maximum value of $Pitch_{scan}$ can be used, then this will allow the lithographic apparatus to operate with a high throughput. Reducing the value of $Pitch_{scan}$ will reduce the throughput of the lithographic apparatus.

If the mirror arrays are separated by the wrong amount (i.e., $SLMD_{scan}$ has the wrong value), then the situation shown in FIG. 7 will arise. That is to say, certain locations on the substrate will receive radiation modulated by four mirror arrays. A separation of the mirror arrays ($SLMD_{scan}$) may be determined which ensures that the maximum value of $Pitch_{scan}$ can be used. This involves adding or subtracting the combination of the length of the stitching overlap ($SLM_{scan}-Pitch_{scan}$) and twice the length of the border (2* BA). If the mirror arrays have borders which do not reflect radiation, or which reflect a negligible amount of radiation, then it is not necessary to take the length of the border into account.

Other values of $SLMD_{scan}$ are possible. In one example, any value of $SLMD_{scan}$ is used that avoids locations on the substrate receiving radiation modulated by mirror arrays on four separate occasions during exposure of a substrate.

It may be beneficial to take into account the scan-speed of the substrate beneath the patterning device, and to consider matching of the sizes of the mirror arrays to dies or other devices being projected onto the substrate.

Although the embodiment shown in FIG. 9 includes adding extra background radiation at various locations, it is not essential that this is done. Staggering the patterns according to the embodiment shown in FIG. 9 provides a beneficial effect even if the extra background radiation is not added.

The addition of background radiation described above may be controlled by a controller CT (see FIG. 1), which is connected to the patterning device. The controller CT may, for example, include a processor and a memory. The processor may be provided with information relating to how patterns will overlap when they are projected onto the substrate, and may include algorithms that determine how much background radiation should be projected from different locations on the arrays. The algorithms may also determine appropriate orientations for the mirrors of the arrays.

Although three mirror arrays are shown in FIG. 2, any number of mirror arrays may be used.

Embodiments of the invention have been described in terms of the overlap of adjacent mirror arrays 100a-c during a scanning exposure. However, during a subsequent scanning exposure, overlap will occur between the previously exposed pattern and the pattern that is being exposed. Additional background radiation may be added to parts of the pattern that are being exposed, in the same manner as has been described above. The position in the y-direction at which the scanning exposure begins, may be selected such that no part of the pattern receives more than 3 times the background radiation.

It may be desired to avoid that a given mirror array overlaps between dies in the x-direction. In other words, when a minor array is directing modulated radiation towards a given die, it may be desired to ensure that it is not at the same time directing modulated radiation towards a die which is adjacent in the x-direction. This may be achieved by providing a blade 110 with an edge that runs parallel to the scanning direction (the y-direction). Blade 110 may be used to mask off one or more minor arrays that would otherwise direct modulated radiation onto a die which is adjacent in the x-direction to a die being patterned.

It may be the case that the patterns provided on the mirror arrays are reproduced on the substrate. Alternatively, there may be some variation between the pattern on the mirror arrays and the pattern on the substrate. The variation may, for example, comprise optical proximity correction features, which are present on the mirror arrays, but which are not seen on the substrate.

Although embodiments of the invention have been described in terms of mirror arrays, arrays of any suitable individually controllable elements may be used.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g., a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A device manufacturing method, comprising:
    applying patterns to a plurality of arrays, each of the arrays comprising individually controllable elements such that the arrays modulate a beam of radiation; and
    projecting the modulated beam of radiation onto a substrate,
    wherein the patterns applied to the arrays are arranged such that pre-determined amounts of background radiation are included in the modulated beam of radiation, the pre-determined amounts of background radiation being different for different locations on the arrays,
    wherein each of the arrays further comprise a static border that does not include individually controllable elements.

2. The device manufacturing method of claim 1, wherein the pre-determined amount of background radiation included in the modulated beam of radiation is greater at a central location of a given one of the arrays than at an edge of the given one of the arrays.

3. The device manufacturing method of claim 1, wherein the pre-determined amounts of background radiation are selected such that a substantially uniform level of background radiation is delivered to different locations on the substrate, irrespective of whether those locations receive radiation from one of the arrays or more than one of the arrays.

4. The device manufacturing method of claim 1, wherein the method further comprises:
    determining which locations on the substrate will receive radiation modulated by more than one of the arrays, and which locations on the substrate will receive radiation modulated by only one of the arrays; and
    arranging the patterns applied to the arrays, such that those locations on the substrate that receive radiation modulated by only one of the arrays will receive substantially a same amount of background radiation as those locations on the substrate that receive radiation modulated by more than one of the arrays.

5. The device manufacturing method of claim 1, wherein the method further comprises:
    determining the amount of background radiation that will be received at different locations on the substrate;
    determining a maximum amount of radiation that will be received on the substrate;
    calculating amounts of additional background radiation to be added to locations on the substrate that receive less than the maximum amount of background radiation; and
    adjusting patterns applied to the arrays accordingly, such that those locations on the substrate receive the maximum amount of background radiation.

6. The device manufacturing method of claim 1, wherein one or more DC offsets are applied to individually controllable elements in different locations of an array, the DC offsets adjusting an amount of background radiation that is included in the modulated beam.

7. The device manufacturing method of claim 1, wherein the individually controllable elements are mirrors.

8. The device manufacturing method of claim 1, wherein positions of patterned regions projected onto the substrate are staggered, such that there are no locations on the substrate that receive more than three patterned regions.

9. The device manufacturing method of claim 8, wherein the staggering of the positions of the patterned regions is such that the patterned regions are not aligned in a direction transverse to a scanning movement of the substrate.

10. A lithographic apparatus, comprising:
    a plurality of arrays comprising individually controllable elements arranged to be patterned, such that the arrays modulate a beam of radiation;
    a projection system arranged to project the modulated beam of radiation onto a substrate; and
    a controller arranged to control patterns provided on the arrays, wherein:
        the controller is arranged to apply patterns to the arrays, the patterns being configured such that pre-determined amounts of background radiation are included in the beam of radiation as modulated by the arrays, the arrays further comprise a static border that does not include individually controllable elements, and the pre-determined amounts of background radiation being different for different locations on the arrays.

11. The apparatus of claim 10, wherein the pattern applied to a given one of the arrays is such that the amount of background radiation included in the radiation beam as modulated by one location on an array is twice as much as the background radiation included in the radiation beam as modulated by a different location on the array.

12. The apparatus of claim 10, wherein the pre-determined amount of background radiation included in the modulated beam of radiation is greater at a central location of a given one of the arrays than at an edge of that array.

13. The apparatus of claim 10, wherein:

the controller is provided with information that indicates which locations on the substrate will receive radiation modulated by more than one of the arrays, and which locations on the substrate will receive radiation modulated by only one of the arrays; and the controller is configured to arrange patterns applied to the arrays, such that those locations on the substrate that receive radiation modulated by only one of the arrays will receive substantially a same amount of background radiation as those locations on the substrate that receive radiation modulated by more than one of the arrays.

14. The apparatus of claim 10, wherein the apparatus further comprises:

a blade arranged to mask off radiation modulated by one or more of the arrays, the blade having an edge that is parallel to a scanning direction of motion of the substrate within the lithographic apparatus, the blade being moveable in a direction that is transverse to a scanning direction of motion.

15. A device manufacturing method, comprising:

modulating a beam of radiation using a plurality of arrays comprising individually controllable elements; and projecting the modulated beam of radiation onto a substrate to form a plurality of patterned regions on the substrate, wherein the arrays further comprise a static border that does not include individually controllable element, and wherein positions of the patterned regions are staggered, such that there are no locations on the substrate that receive more than three patterned regions.

16. The device manufacturing method of claim 15, wherein the staggering of the positions of the patterned regions is such that the patterned regions are not aligned in a direction transverse to a scanning movement of the substrate.

17. A lithographic apparatus, comprising:

a plurality of arrays comprising individually controllable elements arranged to be patterned, such that the arrays modulate a beam of radiation;

a projection system arranged to project the modulated beam of radiation onto a substrate; and a controller arranged to control patterns provided on the arrays, wherein the arrays are not aligned in a direction transverse to a scanning direction of the lithographic apparatus, but instead have a separation in the scanning direction, the separation being a non-integer multiple of a length of an active part of one of the arrays of individually controllable elements in the scanning direction, and wherein the arrays further comprise a static border that does not include individually controllable elements.

18. The apparatus of claim 17, wherein the separation in the scanning direction is determined by $SLMD_{scan} = (M_d * Pitch_{scan} + (SLM_{scan} - Pitch_{scan}) + 2*BA$ and the reduction factor of the projection system of the lithographic apparatus, wherein $M_d$ is an integer, $Pitch_{scan}$ is a length in the lithographic apparatus scanning direction, which is patterned by a given mirror array not including overlap with an adjacent pattern, $SLM_{scan}$ is a length in the scanning direction that is patterned by the mirror array including overlap with an adjacent pattern, and BA is a length in the scanning direction that receives radiation from a border of the mirror array.

19. The apparatus of claim 17, wherein the separation in the scanning direction is an integer number times the length in the lithographic apparatus scanning direction that is patterned by a given one of the mirror arrays not including overlap with an adjacent pattern, plus an amount which is less than half of the length in the lithographic apparatus scanning direction that is patterned by a given mirror array not including overlap with an adjacent pattern.

20. The apparatus of claim 17, the separation in the scanning direction is any value that avoids locations on the substrate receiving radiation modulated by the mirror arrays on four separate occasions during exposure of the substrate.

* * * * *